United States Patent [19]

Adair et al.

[11] Patent Number: 5,485,804
[45] Date of Patent: Jan. 23, 1996

[54] ENHANCED CHEMICAL VAPOR DEPOSITION OF DIAMOND AND RELATED MATERIALS

[75] Inventors: James J. Adair; Rajiv K. Singh, both of Gainesville, Fla.

[73] Assignee: University of Florida, Gainesville, Fla.

[21] Appl. No.: 245,293

[22] Filed: May 17, 1994

[51] Int. Cl.$^6$ ................................................ C30B 29/04
[52] U.S. Cl. ........................ 117/90; 117/94; 117/95; 117/106; 117/929
[58] Field of Search ................... 117/90, 94, 95, 117/106, 929

[56] References Cited

U.S. PATENT DOCUMENTS

| | | | |
|---|---|---|---|
| 5,023,068 | 6/1991 | Jones | 117/929 |
| 5,128,006 | 7/1992 | Mitchell et al. | 204/181.5 |
| 5,242,711 | 9/1993 | DeNatale et al. | 117/929 |
| 5,308,661 | 5/1994 | Feng et al. | 427/535 |
| 5,334,342 | 8/1994 | Harker et al. | 264/317 |

FOREIGN PATENT DOCUMENTS

| | | | |
|---|---|---|---|
| 63-123898 | 5/1988 | Japan | 117/929 |

OTHER PUBLICATIONS

Slipenynk et al, "Stability of a Diamond–Powder Suspension in the Presence of Surfactants and Flocculants", Ukr. Khim. Zh. (Russia Ed) 1993 59(7) pp. 713–717 Abs. Only.

Mortgnova et al. "Adsorption of Amines From Solutions on Synthetic Diamond", Fie. Khim. Kendens. Faz. Sverkhtverdyth Mates, Ikh. Granits Rardeta 1975 pp. 113–116 Abs. Only.

*Primary Examiner*—Robert Kunemund
*Attorney, Agent, or Firm*—Thomas C. Saitta

[57] ABSTRACT

A method for creating a uniform thin film of a high surface energy material on a substrate comprising the steps of providing an oppositely charged surface on the substrate, if such does not exist, from that of particles of the high surface energy material, exposing the substrate to an aqueous colloidal suspension of particles composed of the high surface energy material to adsorb seed particles onto the surface of the substrate, and then depositing a uniform thin film of the high surface energy material by chemical vapor deposition onto the seeded substrate.

12 Claims, 3 Drawing Sheets

FIGURE 1A

FIGURE 1A
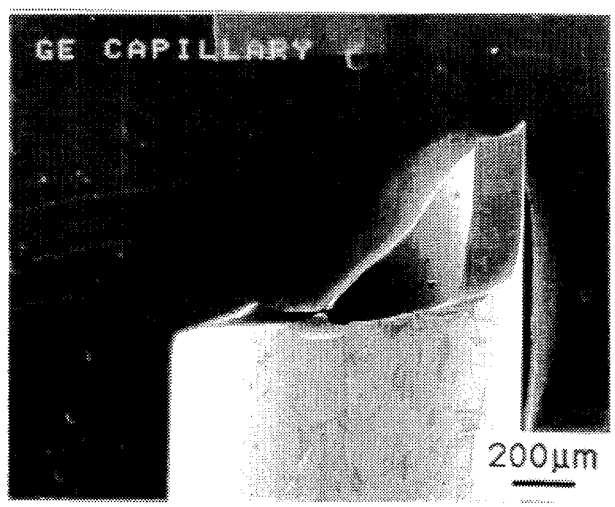
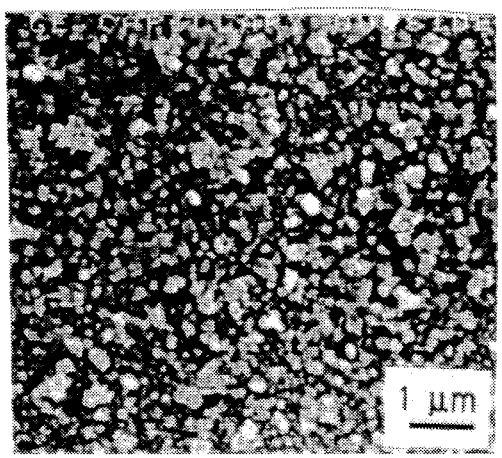
FIGURE 1B
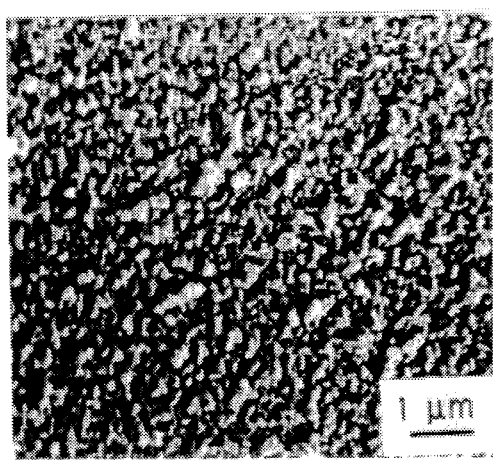
FIGURE 1C
FIGURE 2
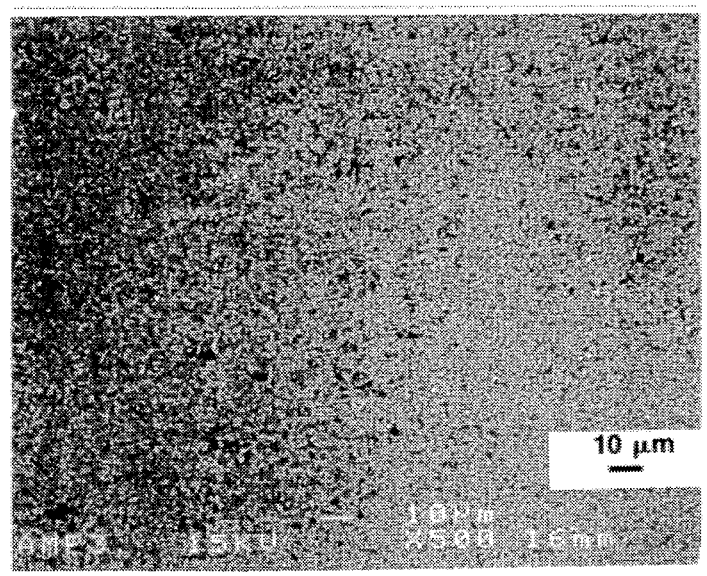

FIGURE 6
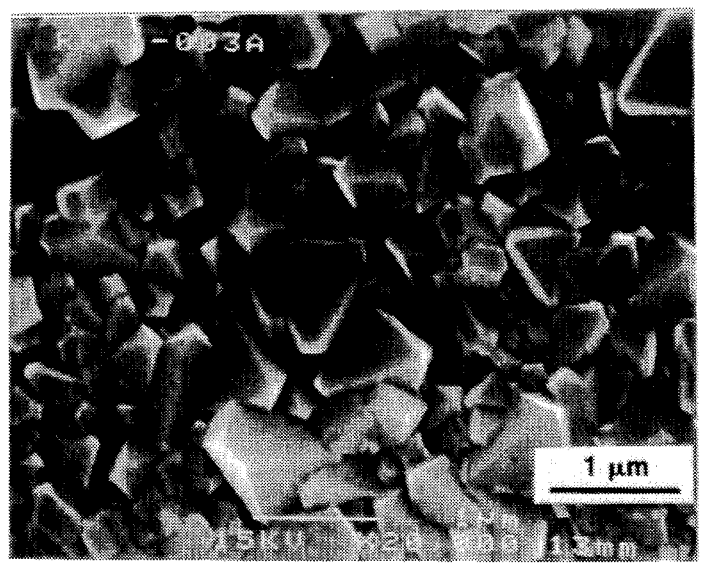
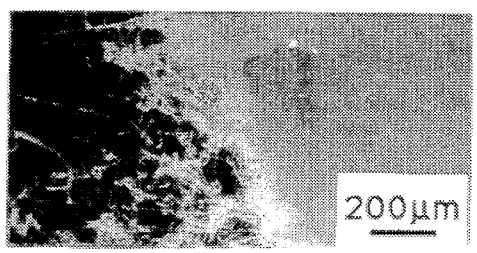
FIGURE 7A
FIGURE 7B
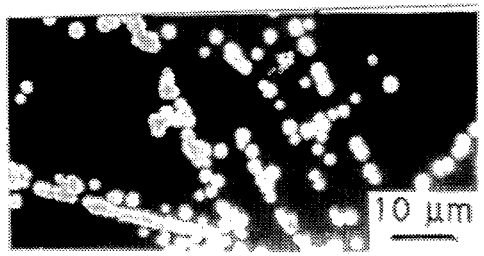
FIGURE 7C
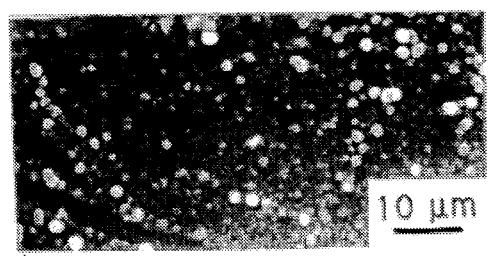
FIGURE 7D
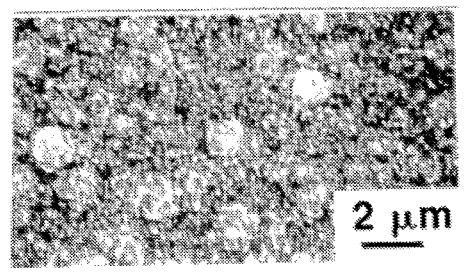

ENHANCED CHEMICAL VAPOR DEPOSITION OF DIAMOND AND RELATED MATERIALS

BACKGROUND OF THE INVENTION

The invention relates generally to an improved chemical vapor deposition (CVD) method for creating films on substrates. More particularly, the invention relates to an improved CVD method for creating films of diamond or similar material on substrates. Even more particularly, the invention relates to an improved CVD method for creating films on substrates whereby the substrate is not damaged. The enhanced CVD of the diamond or other material is accomplished by depositing seed particles onto a suitably charged surface prior to the CVD step.

Material properties in various applications can be improved by the application of film coatings having superior properties relative to the substrate material. Some of the better film materials are difficult to apply however, since creation of some of the most stable film surfaces require large amounts of energy. One technique for creating films of high surface energy materials such as carbides, nitrides, borides, oxides including lead, zirconate titanate, etc. is the known technique of chemical vapor deposition. One of the most desirable coatings is that of diamond, due to its superior properties related to high hardness, low coefficient of friction, high thermal conductivity, heat and corrosion resistance, etc. Applications in which diamond coatings are useful include wear surfaces such as cutting tools, heat sinks for electronic devices, microwave power devices, electro-optical devices, etc. However, application of diamond films, even via the CVD technique, is difficult because of the nature of the material itself.

Most CVD techniques currently employed to create diamond films on a substrate require the substrate surface to be damaged in some manner. For example, it is known to improve CVD of diamond by polishing or scratching the substrate surface, ultrasonicating the surface in a diamond suspension, or etching the surface with plasma. Obviously, damage to the surface of the substrate is not desirable in many applications, such as when the substrate is a silicon wafer to be used in microelectronics. Films created by these techniques are typically patchy and non-uniform with many areas of the substrate remaining uncovered. Valdes et al. has reported a non-damaging electrophoretic technique for depositing diamond in "Selected Area Nucleation and Patterning of Diamond Thin Films by Electrophoretic Seeding" (*J. Electrochem. Soc.*, 138, 635–636 (1991). This technique utilizes an electric field to cause deposition from a colloidal suspension of diamond seeds onto a substrate, which is then treated via conventional CVD to grow a diamond film. This technique results in better coverage, but is limited in that it requires a conductive substrate.

The method of the invention is a non-damaging technique utilizing conventional CVD for growth of diamond films or the like on substrates of any composition, e.g., plastic, glass, metal or ceramic. The method results in rapid, uniform growth of a continuous film, with the ability to control grain size. The method is successful on substrates of any surface configuration, whether electrically conductive or non-conductive. Film growth is several times faster than under the known techniques.

SUMMARY OF THE INVENTION

The invention is a method for enhancing chemical vapor deposition (CVD) of films onto a substrate. The method comprises adsorption of seed particles of the film material from a colloidal suspension onto the substrate prior to the CVD step. For ease of discussion, the invention will be disclosed mainly with reference to diamond film, but it is to be understood that the method is applicable to any high surface energy material capable of film formation through CVD techniques on a substrate, such as carbides, nitrides, borides or certain oxides.

A substrate of any material or configuration is first cleansed. The basis for the seeding technique is that particles of opposite charge to that of the substrate are used. Collisions of particles in the colloidal suspension onto the oppositely charged substrate surface result in electrostatic bonding of the fine particles to the substrate. For example, it has been established that commercially available diamond particles are negatively charged in water from at least pH 2 to pH 11. In the case of silicon wafers, the native silicon dioxide surface layer also imparts a negative surface charge over a similar pH range. Thus, to ensure that the negatively charged diamond particles adhere to the silicon wafer, the wafer is treated with a surface active agent whose adsorption imparts a positive surface charge to the silicon surface. In contrast, substrates with positively charged surfaces do not require a surface treatment to impart a positive charge. Therefore, the diamond particles with negatively charged surfaces interact directly with the positively charged substrate surfaces and a preliminary surface treatment is not required. Likewise, for particles with positive charges, such as lead titanate or aluminum oxide, a negatively charged substrate such as silicon needs no surface treatment, while a positively charged substrate would require treatment with an anionic polymer, such as polymethacrylate.

The substrate is rinsed and submerged in an aqueous suspension of diamond powder, the diamond particles having a diameter of less than 10 microns. The negatively charged diamond particles are adsorbed onto the positively charged substrate surface. The density of the particles adsorbed onto the surface is controlled by varying the concentration of particles in the aqueous solution. The substrate is removed and rinsed. The diamond particles adsorbed on the substrate surface act as seeds for growth of the diamond film, which is formed on the substrate surface using conventional CVD techniques. The result is a uniform, continuous film on the substrates.

BRIEF DESCRIPTION OF THE DRAWINGS

FIG. 1 are scanning electron microscope (SEM) micrographs showing colloidal diamond seeds adsorbed to both the internal and external surfaces of a glass capillary tube.

FIG. 2 is an SEM micrograph of colloidal diamond seeds adsorbed to the surface of a silicon wafer.

FIG. 6 is an SEM micrograph of a diamond film deposited using CVD on the initially seeded surface of a silicon wafer.

FIG. 7 are SEM micrographs showing the difference in diamond film coverage by CVD on a silicon wafer substrate where one half was initially seeded using the technique of the invention and the other half was not.

DETAILED DESCRIPTION OF THE INVENTION

Figure 3:
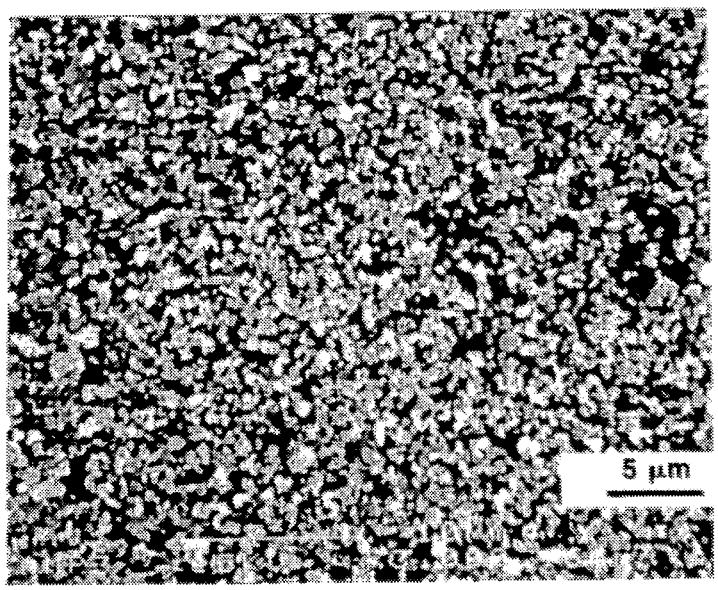
FIG. 3 is an SEM micrograph of the colloidal diamond seeds adsorbed to the surface of the silicon wafer of FIG. 2, shown at higher magnification.

The method is an improved chemical vapor deposition (CVD) technique which comprises steps involving adsorption of seed particles of the film material onto a substrate (treated to alter surface charge if necessary), followed by conventional CVD to form a continuous, uniform film on the substrate. The seeding method is not restricted to any particular substrate compositions or configurations. The seeding method has been utilized on substrates of plastic, glass, ceramic and metal, with configurations ranging from planar to tubular. CVD is used to create films of materials having high surface energies, i.e., those where a large amount of energy is required to create the highly stable films. The method is suitable for many high surface energy materials, such as many carbides, nitrides, borides or oxides containing lead, zirconate titanate or the like. In particular the technique is applicable for the creation of diamond films on substrates. For ease of discussion and because diamond films have wide applicability because of their inherent desirable characteristics, the method shall be disclosed mainly with reference to the creation of a diamond film on a silicon wafer substrate, although it is to be understood that the disclosure is applicable to the numerous film materials and substrates mentioned above.

A commercially obtained silicon wafer is first cleansed of contaminants by a solvent rinse, e.g., a first rinse of acetone followed by a rinse of isopropanol, or any other suitable solvents. It is necessary for the methodology that the surface of the substrate have opposite surface charge to that of the particles. Since diamond particles are inherently negatively charged, a positive charge must be imparted to the surface of the silicon wafer. While the negative charge on the particles could be reversed, it is more efficient to change the surface polarity of the substrate. A positive surface charge on the silicon wafer can be created by treating the substrate with cations or positively charged cationic polymers. The latter is preferred because anions that accompany the cation such as chloride or nitrate, if not removed, may compromise the chemical vapor deposition of the desired material as these are considered contaminants to the material. The positively charged species, as either ions or polyelectrolytes, are strongly attracted and chemically adsorbed to the negatively charged silicon surface because of the large attractive electrostatic forces between the negatively charged silicon substrate and the positively charged chemical species. Preferably, a highly branched polymer, such as polyethyleneimine, is used, as it has been found that these polymers adsorb in a flat conformation on the substrate surface with excellent overall surface coverage. Additionally, all of the monomer units of polyethyleneimine are positively charged over a pH range below pH 9.5 to 10, thereby maximizing the number of adsorption sites for the negatively charged diamond particles. Furthermore, it has been found that once the polyethyleneimine is adsorbed to a silicon surface, the polymer molecules are so strongly bound to the surface that the adsorbed polyethyleneimine molecules are not removed by rigorous washing with deionized water. For a silicon wafer, a solution of 1 to 10 volume percent of polyethyleneimine in water is prepared and the wafer allowed to soak for approximately 2 minutes or more, followed by a rinse with deionized water.

An aqueous suspension of diamond particles is prepared using commercially available diamond powders having particle sizes of less that 10 microns, with preferable particle size being in the area of 0.1 to 0.2 microns. Optimally, the solution is approximately 0.05 to 5.0 volume percent particles in water. Since the larger particles tend to settle rather than become suspended in the solution it is preferred to decant the solution to insure that only fine particles are present. The treated substrate with a positively charged surface is now suspended into the aqueous diamond solution at ambient temperature for a period of time from 30 seconds to 24 hours or more. The negatively charged diamond particles adsorb onto the positively charged adsorption sites of the polymer on the surface of the silicon substrate, creating a large number of individual seeding sites for diamond film growth. The density of the individual diamond particle seeds is a function of the concentration of the aqueous solution, a high concentration resulting in high seed density and a low concentration resulting in low seed density on the surface of the substrate. The density of the seed particles in turn determines the grain size of the final diamond film, smaller grains resulting from high seed density and larger grains resulting from low seed density. The thickness of the seed layer is a function of the orientation of the substrate during exposure. A vertical surface tends to limit itself to a relatively thin layer of 0.1 microns or less, depending on the size of the diamond particles, while a horizontal surface may attain a relatively thick layer up to 100 microns in depth. After sufficient exposure to the diamond colloidal solution, the substrate is removed and rinsed with deionized water to remove any loose diamond particles. If a thick layer is desired, the substrate is allowed to evaporate dry rather than being rinsed.

Finally, conventional CVD techniques are used to create a uniform, continuous diamond film on the substrate. CVD is a well known technique involving the introduction of particular gases into a chamber where an energy source, such as a hot filament or microwave energy, is used to create a plasma for growing a film on a substrate. For example, to create a diamond film on a silicon substrate prepared as described, a combination of methane/hydrogen/oxygen gas or methanol/hydrogen/oxygen gas is passed over a substrate adjacent to a filament heated to approximately 2000 degrees C., resulting in the formation of a diamond film on the substrate surface. If such a hot filament CVD treatment is used, typical substrate temperatures are in the range from 800 to 1000 degree C. and total gas pressure at 20 to 40 Torr. These conditions produce deposition rates from 1 to 5 microns per hour.

Because of the uniformity of coverage of the diamond seeds on the substrate, the film growth is highly accelerated in comparison to conventional diamond film CVD techniques. Uniform, continuous coverage of the substrate can be achieved in less than 20 minutes, as opposed to other techniques which do not result in uniform, continuous coverage even after many hours of CVD. The smaller isotropic grains produced by the enhanced CVD method can have a lower surface roughness than that produced by conventional CVD.

EXAMPLE 1

A commercial glass capillary tube (Fisher Scientific) was treated in a 2.5 weight percent polyethyleneimine solution for 5 hours. The capillary was vigorously washed with deionized water after exposure to the polyethyleneimine solution. A 1.1 volume percent aqueous suspension of a commercially available diamond (General Electric, Series 300 Super Abrasive) was prepared. The polyethyleneimine treated capillary tube was vertically suspended in the diamond suspension for 15 hours. After removal from the diamond suspension, the capillary tube was vigorously washed with deionized water. After air drying the diamond-seeded capillary tube a section was examined in a scanning electron microscope. FIG. 1 shows the capillary tube after this treatment, with higher magnifications of the internal and external surfaces of the tube.

EXAMPLE 2

A diamond suspension ,composed of 1.01 grams of diamond (Dunnington Lonsdaleite phase ¾ micron diamond) and 25 ml deionized water was placed in a 25 ml graduated cylinder. The resulting diamond suspension was allowed to sediment such that after 12 hours, almost all the diamond particles remaining in suspension were submicron (nominal size of the suspended portion was determined to be about 0.2 to 0.3 microns). A fragment of a silicon wafer was treated in 2.5 weight percent polyethyleneimine aqueous solution for approximately 12 hours. After removal from the polyethyleneimine solution and vigorous washing with deionized water, the polyethyleneimine treated silicon wafer fragment was suspended in the sedimented diamond suspension for two hours. After removal from the diamond suspension, the wafer fragment was vigorously washed with deionized water. After air drying the diamond coated silicon wafer a section was examined in a scanning electron microscope. FIGS. 2 and 3 show the surface of the diamond seeded silicon wafer fragment at different magnifications.

EXAMPLE 3

Figure 4:
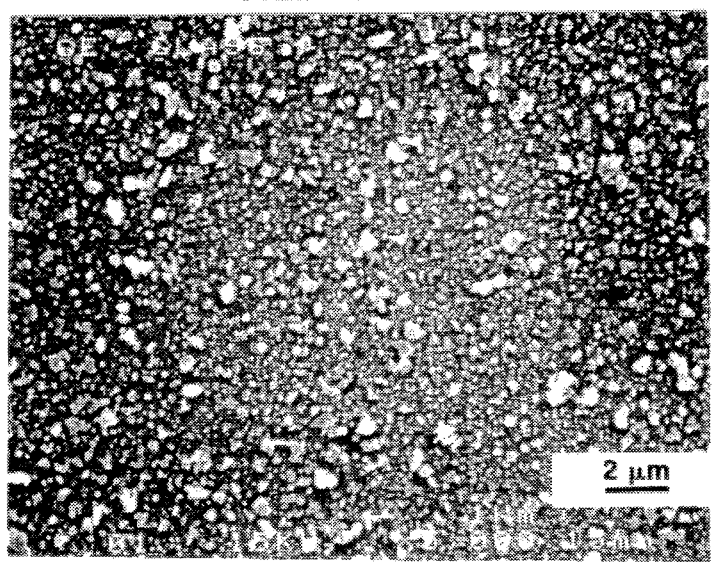
FIG. 4 is an SEM micrograph of colloidal diamond seeds adsorbed to the surface of a soda-lime silicate glass slide.

A soda-lime silicate commercial glass slide (Fisher Scientific) was treated in a 2.5 weight percent polyethyleneimine aqueous solution for 12 hours. The slide was vigorously washed with deionized water after exposure to the polyethyleneimine solution. An aqueous suspension of a commercially available diamond (GE) composed of 0.4 grams diamond powder and 10 ml deionized water was prepared. The polyethyleneimine treated soda-lime silicate glass slide was vertically suspended in the diamond suspension for 15 hours. After removal from the diamond suspension, the glass slide was vigorously washed with deionized water. After air drying the diamond coated glass slide a section was examined in a scanning electron microscope. FIG. 4 shows the diamond seeded surface of the slide after this treatment.

EXAMPLE 4

Figure 5:
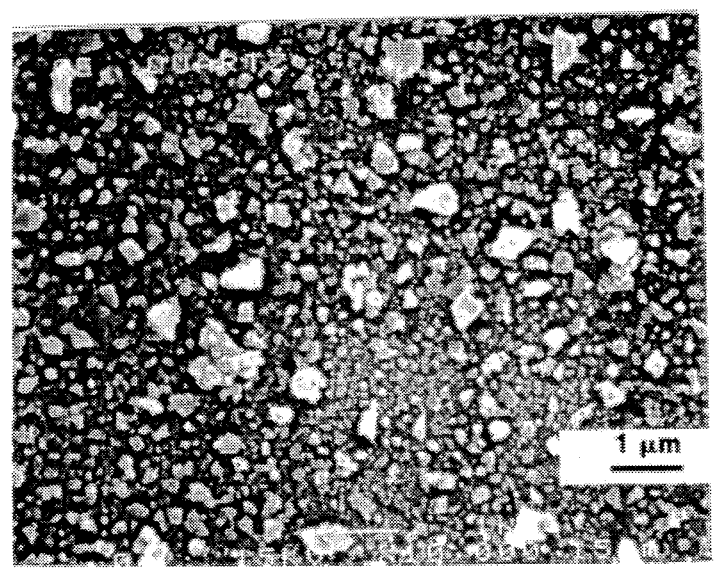
FIG. 5 is an SEM micrograph of colloidal diamond seeds adsorbed to the surface of a fused quartz slide.

A fused quartz commercial slide (SPI) was treated in a 2.5 weight percent polyethyleneimine aqueous solution for 12 hours. The slide was vigorously washed with deionized water after exposure to the polyethyleneimine solution. An aqueous suspension of commercially available diamond (GE) composed of 0.4 grams of diamond powder and 10 ml deionized water was prepared. The polyethyleneimine treated fused quartz slide was vertically suspended in the diamond suspension for 15 hours. After removal from the diamond suspension, the fused quartz slide was vigorously washed with deionized water. After air drying the diamond coated fused quartz slide a section was examined in a scanning electron microscope. FIG. 5 shows the diamond seeded surface of the slide after this treatment.

EXAMPLE 5

A portion of a silicon wafer was completely immersed in 2.5 weight percent aqueous polyethyleneimine solution for 5 hours. The polyethyleneimine treated silicon wafer was removed and then vigorously washed with deionized water. An aqueous solution of a commercially available diamond (GE) composed of 0.354 grams diamond powder in 8.8 ml deionized water was prepared. The silicon wafer was exposed to the aqueous suspension for 15 hours. After removal the silicon wafer was vigorously washed with deionized water and then air dried.

Chemical vapor deposition (CVD) on the diamond seeded silicon wafer fragment was performed using the hot filament technique. The CVD was performed using a tungsten filament at 1900 to 2100 degrees C. at approximately 1 cm from the silicon substrate. An atmosphere of 0.5 to 5 percent methane, 0 to 5 percent oxygen and 90 to 99.5 percent hydrogen at a flow rate of 10 to 25 sccm was maintained with a carbon to oxygen ratio equal to 1. The temperature of the diamond seeded substrate was between 800 and 1000 degrees C. CVD on the diamond seeded silicon substrate was conducted for 60 to 90 minutes. The diamond seeding combined with the CVD resulted in formation of a dense diamond film consisting of well-faceted diamond grains, as shown in the scanning electron photomicrograph of FIG. 6.

EXAMPLE 6

A portion of a silicon wafer :measuring approximately 1 cm long by about 0.3 cm wide was partially suspended by locking forceps in a 2.5 weight percent aqueous polyethyleneimine solution for 24 hours. Only about one half of the silicon wafer fragment was exposed to the aqueous polyethyleneimine solution, with the other half remaining dry. The silicon wafer was removed and vigorously washed with deionized water. An aqueous suspension of a commercially available diamond (GE) composed of 3 weight percent diamond powder in deionized water was prepared. The polyethyleneimine coated half of the silicon wafer was then vertically suspended in the diamond suspension for 12 hours, with the untreated half not exposed to the diamond suspension. After removal, the wafer was vigorously washed with deionized water and air dried.

Chemical vapor deposition of the one-half diamond seeded, one-half unseeded silicon wafer fragment was performed using the hot filament technique. The CVD was performed using a tungsten filament approximately 1 cm from the silicon substrate in a 2 percent methane, 98 percent hydrogen gas mixture with a total pressure of 20 Torr and a starting temperature of approximately 950 degrees C. CVD on the sample was conducted for 105 minutes. Examination under a scanning electron microscope shows a marked difference between the seeded and unseeded sides of the silicon wafer, as seen in FIG. 7. The untreated, unseeded half shows very little diamond growth with the CVD technique. However, the treated, seeded half shows the presence of a continuous diamond film.

It is acknowledged that obvious substitutions or equivalents may be known to those skilled in the art. The above examples are by way of illustration only, and the true scope and definition of the invention is to be as set forth in the following claims.

We claim:

1. A method for the formation of a film composed of a high surface energy material on a substrate comprising the steps of:

(A) providing a substrate having a surface charge opposite to the surface charge of particles of a high surface energy material;

(B) electrostatically adsorbing a number of said particles onto said substrate by exposing said substrate to an aqueous colloidal suspension of said particles of said high surface energy material;

(C) removing said substrate from said aqueous colloidal suspension; and (D) depositing a film of said high surface energy material onto said substrate and said adsorbed particles by chemical vapor deposition.

2. The method of claim 1, where said step of providing said oppositely charged surface on said substrate comprises chemically adsorbing cations onto said substrate.

3. The method of claim 1, where said step of providing said oppositely charged surface on said substrate comprises adsorbing a cationic polymer onto said substrate.

4. The method of claim 1, where said step of providing said oppositely charged surface on said substrate comprises chemically adsorbing anions onto said substrate.

5. The method of claim 1, where said step of providing said oppositely charged surface on said substrate comprises adsorbing an anionic polymer onto said substrate.

6. The method of claim 1, where said aqueous colloidal suspension comprises from 0.05 to 5.0 volume percent high surface energy particles with diameter of less than 10 microns.

7. The method of claim 6, where said aqueous colloidal suspension comprises said particles with diameter between 0.1 and 0.2 microns.

8. The method of claim 1, where said high surface energy material is diamond.

9. The method of claim 1, where said high surface energy material is a nitride.

10. The method of claim 1, where said high surface energy material is a boride.

11. The method of claim 1, where said high surface energy material is an oxide.

12. The method of claim 3, where said cationic polymer is polyethyleneimine.

* * * * *

UNITED STATES PATENT AND TRADEMARK OFFICE
CERTIFICATE OF CORRECTION

PATENT NO. : 5,485,804
DATED : January 23, 1996
INVENTOR(S) : Adair, et al

It is certified that error appears in the above-indentified patent and that said Letters Patent is hereby corrected as shown below:

On the title page, item [75] Inventors: "James J. Adair" should read
--James H. Adair--

Signed and Sealed this

Second Day of April, 1996

Attest:

BRUCE LEHMAN

*Attesting Officer*   *Commissioner of Patents and Trademarks*